Figure 1:
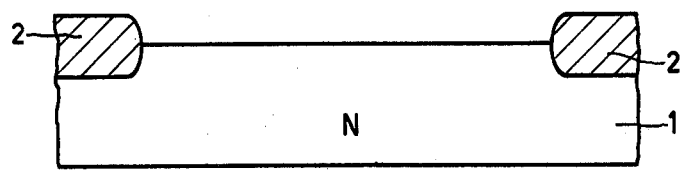

United States Patent [19]

Sanders et al.

[11] 4,374,699

[45] Feb. 22, 1983

[54] METHOD OF MANUFACTURING A SEMICONDUCTOR DEVICE

[75] Inventors: Jozef A. M. Sanders, Sunnyvale, Calif.; Franciscus H. M. Sanders, Eindhoven, Netherlands

[73] Assignee: U.S. Philips Corporation, New York, N.Y.

[21] Appl. No.: 281,759

[22] Filed: Jul. 9, 1981

[30] Foreign Application Priority Data

Jul. 11, 1980 [NL] Netherlands ..................... 8004008

[51] Int. Cl.³ ................. B44C 1/22; C03C 15/00; C03C 25/06
[52] U.S. Cl. .................................. 156/643; 156/646; 156/659.1; 156/668; 204/192 E; 252/79.1; 427/38; 430/313; 430/329

[58] Field of Search ............... 156/643, 646, 659.1, 156/668; 204/192 E; 252/79.1; 427/38, 39, 41, 43.1; 430/329, 313

[56] References Cited

U.S. PATENT DOCUMENTS 3,867,216  2/1975  Jacob .................................. 156/643
4,260,649  4/1981  Dension ........................ 156/635 X

*Primary Examiner*—William A. Powell
*Attorney, Agent, or Firm*—Paul R. Miller

[57] ABSTRACT

A method of manufacturing a semiconductor device in which an organic lacquer layer which is locally present on a substrate is etched by bringing the layer into contact with constituents of plasma which is formed in a gas mixture which contains a halogen compound and an oxygen compound. If the mixture contains more than 25% by volume of an oxygen compound from the group $CO_2$ and NO, the organic lacquer layer can be etched away from 500 to 1000 times faster than poly Si.

4 Claims, 6 Drawing Figures

METHOD OF MANUFACTURING A SEMICONDUCTOR DEVICE

The invention relates to a method of manufacturing a semiconductor device in which an organic lacquer layer which is locally present on a substrate is etched by bringing the layer into the contact with constituents of a plasma which is formed in a gas mixture which contains a halogen compound and an oxygen compound, the oxygen compound representing more than 25% by vol. of the gas mixture. The lacquer layer can then be brought into contact with only electrically non-charged constituents of the plasma like, for example, in customary tunnel reactors, but also with a mixture of electrically charged and non-charged constituents of the plasma like, for example, in customary planar reactors.

A method of this kind is particularly suitable, for example, for manufacturing semiconductor devices where, in order to form electrically conductive tracks on a substrate, the entire substrate is covered with a conductive layer of metal or poly-Si, portions of which are covered with a layer of organic lacquer, after which the non-covered portions are removed. Finally, the layer of organic lacquer is removed by means of a method of the kind set forth. Local attack of the conductive layer situated underneath the organic layer is then liable to occur. In order to counteract attack in practice as much as possible, the ratio of the rates at which the organic lacquer and the conductive layer are etched, the "etching selectivity", should be as high as possible.

U.S. Pat. No. 3,867,216 describes a method of the kind set forth in which the layer of organic lacquer is etched by bringing the layer into contact with constituents of a plasma which is formed in a gas mixture which contains $CF_4$ as the halogen compound and $O_2$ as the oxygen compound. Organic lacquer can be removed thereby approximately one hundred times faster than a conductive layer of poly Si.

The known method has a drawback in that the ratio of the rates at which organic lacquer and poly Si can be etched away is limited. As a result, a conductive layer of poly Si which is situated underneath an organic lacquer layer is attacked in practice. If conductive tracks are formed in the conductive layer, the smallest pattern details which can be realized are limited by such attack.

It is an object of the invention to mitigate this drawback. To this end, a method of the kind set forth in accordance with the invention is characterized in that the gas mixture in which the plasma is formed contains a compound from the group NO and $CO_2$ as the oxygen compound. By the addition of an oxygen compound from the group $CO_2$ and NO instead of $O_2$ to the gas mixture in which the plasma is formed, the ratio of the etching rates at which organic lacquer and conductive layer material are removed is substantially increased. In practice, attack of the conductive layer can hardly be measured. A gas mixture which can be particularly easily used contains $CF_4$ as the halogen compound in addition to an oxygen compound from the group $CO_2$ and NO.

In a preferred embodiment of the method in accordance with the invention, the gas mixture in which the etching plasma is formed contains from 65 to 85% by volume of $CO_2$ as the oxygen compound in addition to $CF_4$. Constituents of a plasma formed in this gas mixture can remove organic lacquer approximately one thousand times faster than a conductive layer of poly Si.

In a further preferred embodiment of the method in accordance with the invention, the gas mixture in which the etching plasma is formed contains from 55 to 75% by volume of NO as oxygen compound in addition to $CF_4$. Using a plasma formed in this gas mixture, photolacquer can be removed approximately five hundred times faster than a conductive layer of poly Si.

The invention will be described in detail hereinafter, by way of example, with reference to the drawing and some embodiments.

Figure 5:
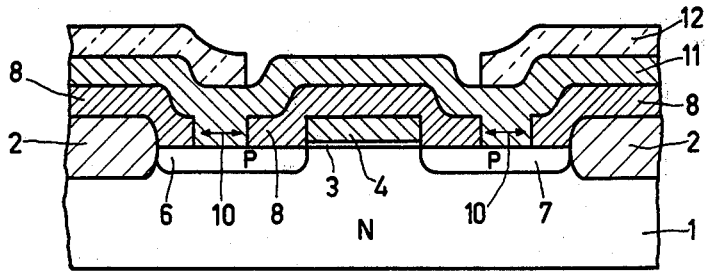
Figure 6:
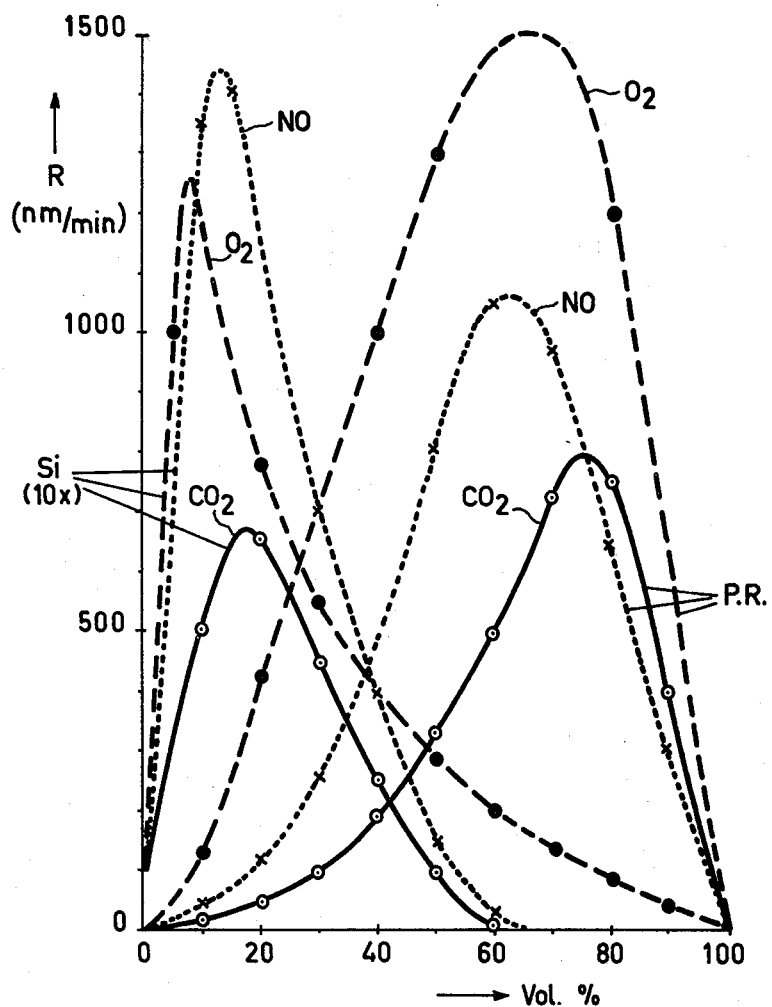

FIGS. 1 to 5 are diagrammatic cross sectional view of successive stages of the manufacture of a part of a semiconductor device using the method in accordance with the invention, FIG. 6 shows etching rates of poly Si and organic lacquer obtained during etching by means of constituents of plasmas formed in $CF_4/CO_2$, $CF_4/NO$ and, for the purpose of comparison, in $CF_4/O_2$ mixtures containing variable quantities of $CO_2$, NO and $O_2$, respectively.

FIGS. 1 to 5 diagrammatically show successive stages of manufacture of a field effect transistor utilizing a basic material in the form of an N-type Si substrate 1 which is subdivided in a customary manner into mutually insulated fields by means of $SiO_2$ regions 2 which have a thickness of approximately 1000 nm and which are also referred to as field oxide (FIG. 1). For the sake of clarity, only one such field is shown; however, in practice an Si-substrate of this kind comprises many such fields.

Figure 2:
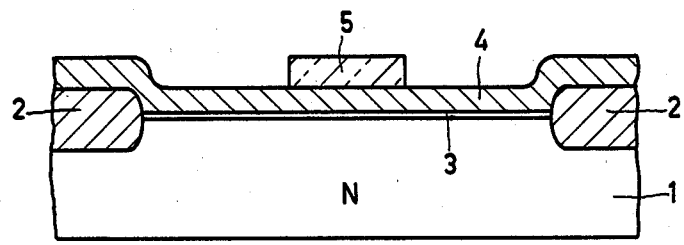

After the formation of the field oxide 2, the substrate 1 is provided with a thin layer of so-called gate oxide 3 which has a thickness of approximately 10 nm, after which the assembly is covered with a layer 4 of metal or poly Si and a layer 5 of organic lacquer in order to form a conductive track which serves as a gate electrode. The lacquer layer 5 also serves to define the location of the gate of the field effect transistor (FIG. 2).

Figure 3:
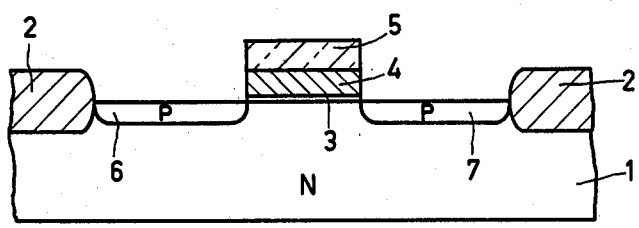
Figure 4:
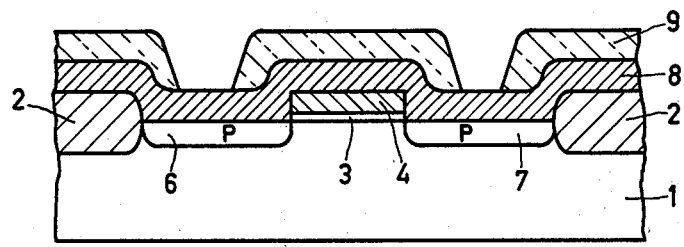

Subsequently, the portions of the layer 4 of poly Si which are not covered by the lacquer layer 5 and the portions of the layer 3 of $SiO_2$ which are situated therebelow are removed; in the portions of the Si-substrate 1 thus uncovered P-type Si-regions 6 and 7 are formed by B-ion implantation, the regions later serving as source and drain of the transistor (FIG. 3).

After removal of the lacquer layer 5, the assembly is covered in known manner with an insulating layer 8 of $SiO_2$ in which windows 10 for the contacting of P-type Si regions 6 and 7 are formed (FIG. 4) in a customary manner by means of a masking layer 9 of photolacquer.

After the formation of the windows 10, the masking layer 9 is removed in a customary manner and the assembly is completely covered again with a conductive layer 11 of metal or poly Si in order to form conductive tracks which serve as source and drain electrodes. Portions of the lacquer layer are covered in a customary manner by means of a layer 12 of organic lacquer, after which the non-covered portions are removed in a customary manner (FIG. 5). Finally, the layer of organic lacquer is removed by bringing the layer into contact with constituents of a plasma which is formed in a gas mixture which contains a halogen compound and an oxygen compound, the oxygen compound representing more than 25% by volume of the gas mixture. In accordance with the invention, the gas mixture contains NO or $CO_2$ as the oxygen compound. As a result, organic lacquer can be etched away approximately five hundred to one thousand times faster than poly Si.

For the embodiments to be described hereinafter, Si-discs having a diameter of approximately 100 mm and covered with layers of Mo or poly Si, having a thickness of 250 to 500 nm and provided on a substrate of $SiO_2$, were etched in a plasma etching generator. Portions not to be etched were covered by means of an organic lacquer having a thickness of from 1000 to 1500 nm. At a substrate temperature of approximately 125° C., the discs thus treated were brought into contact with an etching plasma generated in the reactor at a frequency of 13.56 MHz, a power of approximately 150 W and a gas flow of from 100 to 300 SCC/min.

EXAMPLE I

FIG. 6 shows the etching rate R in nm/min at which organic lacquer (PR) and poly Si (Si) are etched away during the etching with non-charged constituents of plasmas formed in gas mixtures of $CF_4$ and $CO_2$, $CF_4$ and NO at a total pressure of approximately 60 Pa and, for the purpose of comparison, in gas mixtures of $CF_4$ and $O_2$ with a total pressure of approximately 60 Pa as a function of the quantity in % by volume of $CO_2$, NO and $O_2$, respectively, added to the gas mixture.

It appears that the ratio of the etching rates of organic lacquer and poly Si, i.e. the "selectivity", is approximately 100 for $CF_4/O_2$ mixtures (approximately 70% by volume of $O_2$), at the most approximately 1000 for $CF_4/CO_2$ mixtures (approximately 75% by volume of $CO_2$), and at the most approximately 500 for $CF_4/NO$ mixtures (approximately 60% by volume of NO). The selectivity which can be achieved by means of $CF_4/O_2$ mixtures, therefore, is substantially increased by the other additions.

EXAMPLE II

Organic lacquer can also be suitably removed from poly Si by means of constituents of plasmas formed in $SF_6/NO$ mixtures. If the mixture contains 70% by volume of NO, a selectivity (lacquer/poly Si) of approximately 300 is obtained.

EXAMPLE III

Constituents of plasmas formed in $CF_3Cl/NO$ mixtures can remove organic lacquer approximately 200 times faster than poly Si if the mixture contains approximately 80% by volume of NO.

What is claimed is:

1. In a method of manufacturing a semiconductor device having an organic lacquer layer locally present on a substrate comprising plasma etching said layer with a gas mixture containing a halogen compound and an oxygen compound representing more than 25% by volume of said gas mixture, the improvement comprising forming said oxygen compound from the group NO and $CO_2$.

2. A method according to claim 1, wherein said halogen compound contains $CF_4$.

3. A method according to claim 2, wherein said oxygen compound contains from 65 to 85% by volume of $CO_2$.

4. A method according to claim 2, wherein said oxygen compound contains from 55 to 75% by volume of NO.

* * * * *